United States Patent [19]
Latz et al.

[11] Patent Number: 5,169,509
[45] Date of Patent: Dec. 8, 1992

[54] APPARATUS FOR THE REACTIVE COATING OF A SUBSTRATE

[75] Inventors: Rudolf Latz; Michael Schanz, both of Rodgau; Michael Scherer, Rodenbach; Joachim Szczyrbowski, Goldbach, all of Fed. Rep. of Germany

[73] Assignee: Leybold Aktiengesellschaft, Hanau, Fed. Rep. of Germany

[21] Appl. No.: 697,712

[22] Filed: May 9, 1991

[30] Foreign Application Priority Data

Mar. 4, 1991 [DE] Fed. Rep. of Germany ....... 4106770

[51] Int. Cl.$^5$ ............................................. C23C 14/54
[52] U.S. Cl. .......................... 204/298.03; 204/192.13; 204/298.07; 204/298.08; 204/298.18; 204/298.19
[58] Field of Search .............. 204/298.07, 298.08, 204/298.18, 298.19, 298.03, 192.12, 192.15, 192.13

[56] References Cited

U.S. PATENT DOCUMENTS

| | | | |
|---|---|---|---|
| 3,860,507 | 1/1975 | Vossen, Jr. | 204/192.12 |
| 4,166,784 | 9/1979 | Chapin et al. | 204/192.13 |
| 4,738,761 | 4/1988 | Bobbio et al. | 204/192.12 |
| 4,956,070 | 9/1990 | Nakada et al. | 204/298.18 |
| 4,981,566 | 1/1991 | Wurczinger | 204/192.13 |

FOREIGN PATENT DOCUMENTS

| | | | |
|---|---|---|---|
| 3802852 | 8/1989 | Fed. Rep. of Germany | 204/298.08 |
| 3912572 | 11/1989 | Fed. Rep. of Germany | 204/298.18 |
| 95311 | 8/1970 | France | 204/298.08 |
| 252205 | 12/1987 | German Democratic Rep. | 204/298.19 |
| 61-179864 | 8/1986 | Japan | 204/298.18 |
| 1172106 | 11/1969 | United Kingdom | 204/298.07 |

Primary Examiner—Aaron Weisstuch
Attorney, Agent, or Firm—Felfe & Lynch

[57] ABSTRACT

A pair of magnetron cathodes in an evacuable coating chamber are each connected to an ungrounded output of an A.C. power supply. The discharge voltage of at least one of the cathodes is measured and the flow of reactive gas into the chamber is controlled so that the measured voltage is identical to a desired voltage.

5 Claims, 1 Drawing Sheet

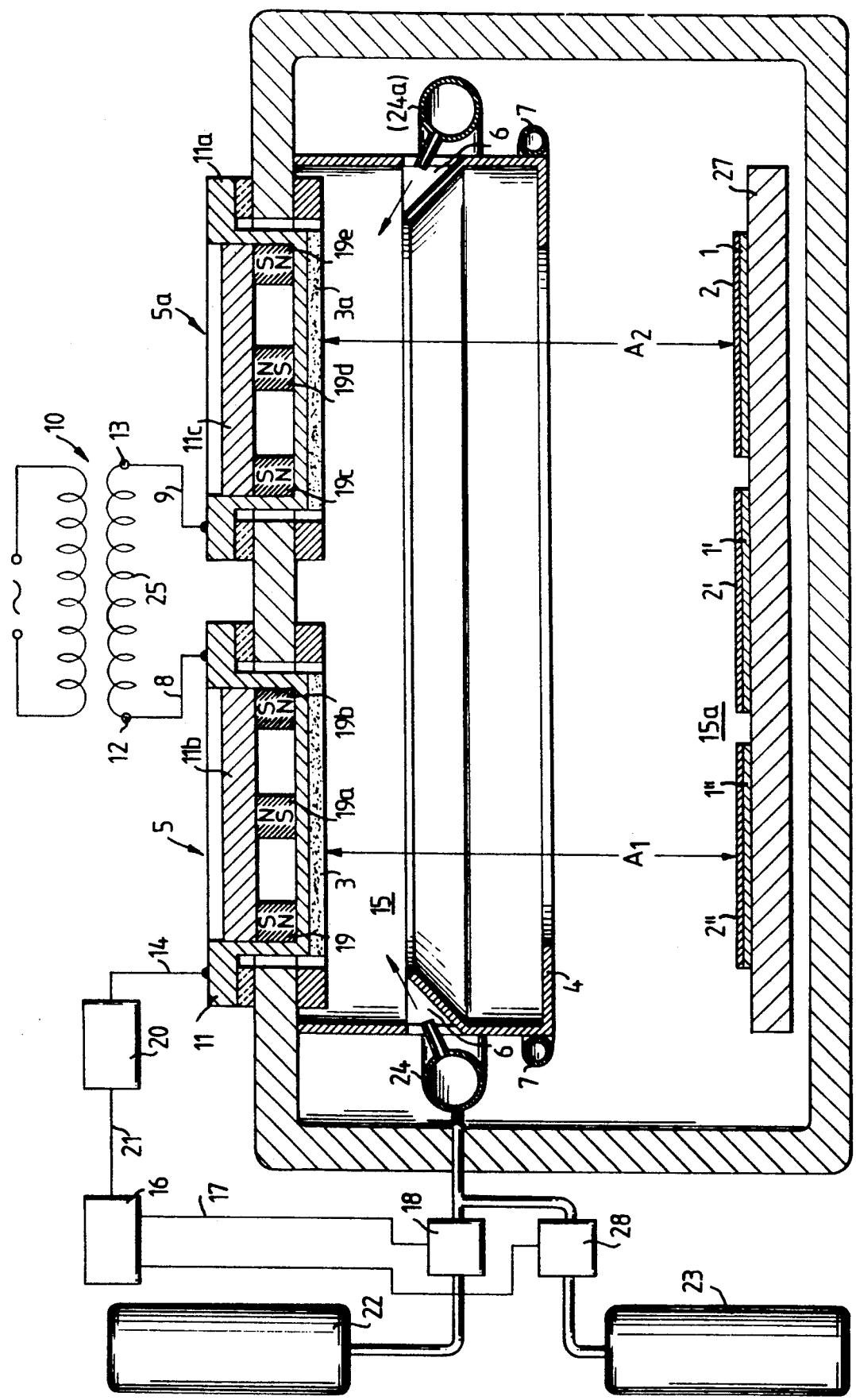

APPARATUS FOR THE REACTIVE COATING OF A SUBSTRATE

BACKGROUND OF THE INVENTION

The invention relates to an apparatus for the reactive coating of a substrate with an electrically insulating material, for example silicon dioxide ($SiO_2$). It comprises an A.C. power supply which is connected to an electrode disposed in an evacuable coating chamber which in turn is electrically connected to targets to be sputtered. The sputtered particles thereof are deposited on the substrate while a process gas and a reactive gas are supplied to the coating chamber.

The problem in known processes for coating substrates by means of cathode sputtering using materials with a high affinity for the reactive gas is that aside from the substrate, parts of the apparatus like the inside wall of the process chamber or parts of diaphragms or the target surface are coated with materials that are not electrically conductive or only poorly conductive. This frequently entails an alteration of the process parameters and, particularly, electrical arcings which cause not only a frequent interruption of the process but also require a frequent cleaning or replacing of parts of the apparatus.

A sputtering apparatus (U.S. Pat. No. 3,860,507) is known which operates on radio frequency, preferably at 13.56 MHz, where two diametrically opposed targets are provided in the process chamber. These targets are connected to the two outputs of the secondary coil of an A.C. transformer via electrodes. The secondary coil has a central tapping which is electrically connected to the wall of the process chamber in such a manner that a glow discharge forms between the two targets.

Further, an apparatus is known (DE-OS 38 02 852) for coating a substrate with a material obtained from a plasma where the substrate is located between a first and a second electrode. The first electrode is connected to the first terminal of an A.C. power supply, and the second electrode to the second terminal of the A.C. power supply. In this case, the source of the alternating current is configured as a stray field transformer to which power is supplied from a shielded arc welding unit or a similarly controlled A.C. power supply. Moreover, the two electrodes can optionally be connected to a D.C. power supply.

Finally, a sputtering apparatus is known (DD 252 205 A1) which comprises a magnet system and at least two electrodes disposed thereabove which are made of the material to be sputtered and switched such that they alternatingly function as cathode and anode of a gas discharge. The electrodes are connected to a sinusoidal alternating voltage of preferably 50 Hz. Each electrode is associated with an independent magnet system where one pole of the one magnet system is also the pole of an adjacent magnet system. The electrodes are disposed in one plane.

SUMMARY OF THE INVENTION

It an object of the present invention to create an apparatus for sputtering materials with a high affinity for a reactive gas which allows a uniform and stable process and, further, operates trouble-free and, particularly, free of arcings even during extended periods of use while depositing insulating layers like $SiO_2$, $Al_2O_3$, $NiSi_2$-oxide, $ZrO_2$, $TiO_2$, $ZnO$, $SnO_2$, $Si_3N_4$, for example. These layers are to exhibit a particular strong adhesion to the substrate.

This object is accomplished in accordance with the invention by means of electrodes which are electrically separated and also separated from the sputtering chamber but are still adjacent to each other. They are configured as magnetron cathodes where the cathode bases and the material of the target are electrically connected to the ungrounded outputs of an A.C. power source. For this purpose, the power supply has an output with two terminals which, for example, are the two ends of a transformer secondary coil.

BRIEF DESCRIPTION OF THE DRAWING

The sole FIGURE is a cross section through a sputtering apparatus with two magnetron sputtering cathodes.

DETAILED DESCRIPTION OF THE PREFERRED EMBODIMENT

The drawing shows the substrates 1, 1', 1" each of which is to be coated with a thin layer 2, 2', 2" of oxide (e.g. silicon dioxide or aluminum oxide). The targets 3, 3a to be sputtered are located opposite theses substrates 1, 1', 1" at like distanced $A_1$, $A_2$. Each target 3, 3a is connected to a cathode base 11, 11a accommodating a magnet yoke 11b, 11c each having three magnets 19, 19a, 19b and 19c, 19d, 19e, respectively. The targets are made of Al, Si, Ti, Ta, Zn, Sn, Zr or compounds of these elements. The layers 2, 2', 2" are deposited by means of sputtering as $Al_2O_3$, $AlN$, $SiO_2$, $Si_3N_4$, $SiO_xN_y$, $TiO_2$, $Ta_2O_5$, $SnO_2$, $ZnO$ or $ZrO_2$ under the addition of oxygen or nitrogen, corresponding to the target material selected.

The polarities of the poles of the six magnets which are directed toward the target alternate so that the south poles of the two outer magnets 19, 19b and 19c, 19e together with the north poles of the respective inner magnet 10a 19a and 19d form approximate circular arc-like magnetic fields across the targets 3, 3a. These magnetic fields condense the plasma in front of the target so that it reaches its highest density where the magnetic field have the maxima of their circular arcs. The ions in the plasma are accelerated by the electric fields generated by an alternating voltage supplied by power supply 10. The adjacent magnetron cathodes 5, 5a associated with respective targets 3, 3a enclose an angle of 110° to 180° (shown as 180° in the FIGURE).

This power supply 10 has two terminals 12, 13 formed by the two ends of a transformer secondary coil 25 and connected to the two cathodes 5 and 5a. The two current conductors 8, 9 of the transformer secondary coil 25 are connected to respective targets 3, 3a.

Moreover, target 3, via a line 14, is connected to a grounded device 20 for the sensing of effective voltage values. Line 21 connects this device 20 to a control 16 which in turn, via line 17, is connected to a control valve or flow regulator 18 regulating the flow of reactive gas such as oxygen or nitrogen contained in cylinder 22 to the distributing line 24 vacuum chamber 15, 15a. The flow of reactive gas is regulated by control 16 so that the measured voltage is identical to a desired voltage. Line 30 connects the control 16 to a flow regulator 28 which regulates the flow of process gas such as argon contained in cylinder 23 to the distributing line 24. The cathodes 3, 3a may also be provided with respective independent distributing lines 24, 24a, with an additional control line 17a and an additional flow regulator 18a.

Coating chamber 15, 15a has an annular or frame-like shielding plate or diaphragm 4 which is provided with a gap or slot 6 through which the process gas from distributing line 24, in direction of the arrow, can flow into the coating chamber 15. The lower edge of diaphragm 4 is also surrounded by a cooling pipe 7 through which a coolant passes preventing an excessive heating of diaphragm 4.

During the sputtering, the frequency of the A.C. power supply 10 is selected such that the ions can still follow the alternating field. This is given at a frequency between approximately 1 KHz and 100 KHz. The device 20 for sensing the effective value of the voltage supplies, via line 21, supplies the discharge voltage tapped via line 14 as a direct voltage to control 16. Control 16 in turn, via line 17, actuates magnetic valve 18 to supply reactive gas in such a manner that the measured voltage determines the required amount of reactive gas.

We claim:

1. Apparatus for reactively sputter coating a substrate with an electrically insulating material, comprising
    an evacuable coating chamber,
    means in said chamber for distributing a process gas in said chamber,
    means in said chamber for distributing a reactive gas in said chamber,
    an A.C. power supply having two ungrounded outputs,
    a pair of magnetron cathodes each enclosing a plurality of magnets and holding a target to be sputtered in said chamber, each cathode being connected to a respective ungrounded output of said A.C. power supply and exhibiting a discharge voltage during operation,
    means for measuring the discharge voltage of at least one of said cathodes and producing a measured voltage, and
    flow control means for controlling the flow of reactive gas to said reactive gas distribution means in such a manner that the measured voltage is identical to a desired voltage.

2. Apparatus in accordance with claim 1, characterized in that the pair of magnetron cathodes enclose an angle between 180° and 110°.

3. Apparatus as in claim 1 wherein said A.C. power supply comprises an A.C. transformer with a secondary coil having said two ungrounded outputs.

4. Apparatus as in claim 1 wherein
    said means for distributing said reactive gas comprises two independent distribution lines associated with respective cathodes,
    said means for measuring the discharge voltage measures the voltage of both of said cathodes and produces said measured voltage as the difference between said discharge voltages, and
    said flow control means controls the flow of reactive gas to said two independent distribution lines so that the measured voltage is identical with a desired voltage.

5. Apparatus as in claim 4 wherein said flow control means comprises two independently controlled flow regulators.

* * * * *